United States Patent [19]

Morse et al.

[11] Patent Number: 4,523,258
[45] Date of Patent: Jun. 11, 1985

[54] FLEXIBLE SAFETY BELT WITH FLASHING LIGHT-EMITTING DEVICES AND ALARM

[76] Inventors: John H. Morse, 3437 Catalina Dr., Chamblee, Ga. 30341; Robert Skrynecki, 2754 FosterRidge Rd., Atlanta, Ga. 30345

[21] Appl. No.: 594,854

[22] Filed: Mar. 29, 1984

Related U.S. Application Data

[63] Continuation-in-part of Ser. No. 533,233, Sep. 19, 1983, abandoned.

[51] Int. Cl.³ .............................................. F21L 15/14
[52] U.S. Cl. ................................... 362/108; 362/295; 362/800; 362/806
[58] Field of Search ............... 362/108, 800, 806, 295; 315/76, 86

[56] References Cited

U.S. PATENT DOCUMENTS

| | | | |
|---|---|---|---|
| 3,101,454 | 8/1963 | Gossland | 315/76 X |
| 3,871,170 | 3/1975 | Bergey | 362/23 X |
| 3,927,375 | 12/1975 | Lanoe et al. | 362/157 X |
| 3,944,803 | 3/1976 | Chao | 362/108 |
| 4,093,943 | 6/1978 | Knight | 362/227 X |
| 4,161,018 | 7/1979 | Briggs et al. | 362/104 |
| 4,231,079 | 10/1980 | Heminover | 362/108 X |
| 4,264,845 | 4/1981 | Bednarz | 362/800 X |
| 4,283,756 | 8/1981 | Beamon | 362/252 X |
| 4,384,317 | 5/1983 | Stackpole | 362/800 X |

Primary Examiner—Peter A. Nelson
Attorney, Agent, or Firm—Sherman & Shalloway

[57] ABSTRACT

A flexible safety belt which may be easily worn about the waist of a pedestrian or runner is disclosed. The belt includes an arrangement for fastening the ends together and a plurality of light-emitting diodes disposed along the outer surface of the belt. A pair of oscillators having distinct different frequencies are connected to each of a respective pair of nodes between which all of the diodes are connected. The diodes are connected so that the lower frequency oscillator conditions a set of diodes to be flashed by the output of the higher frequency oscillator when the low frequency oscillator is in one state and the balance of the diodes to be flashed by the high frequency oscillator when the lower frequency oscillator output is in the opposite state. The electronic circuitry is all constructed on a flexible circuit board disposed within the hollow interior of the belt, with the circuitry also preferably including a separately controllable alarm means.

8 Claims, 5 Drawing Figures

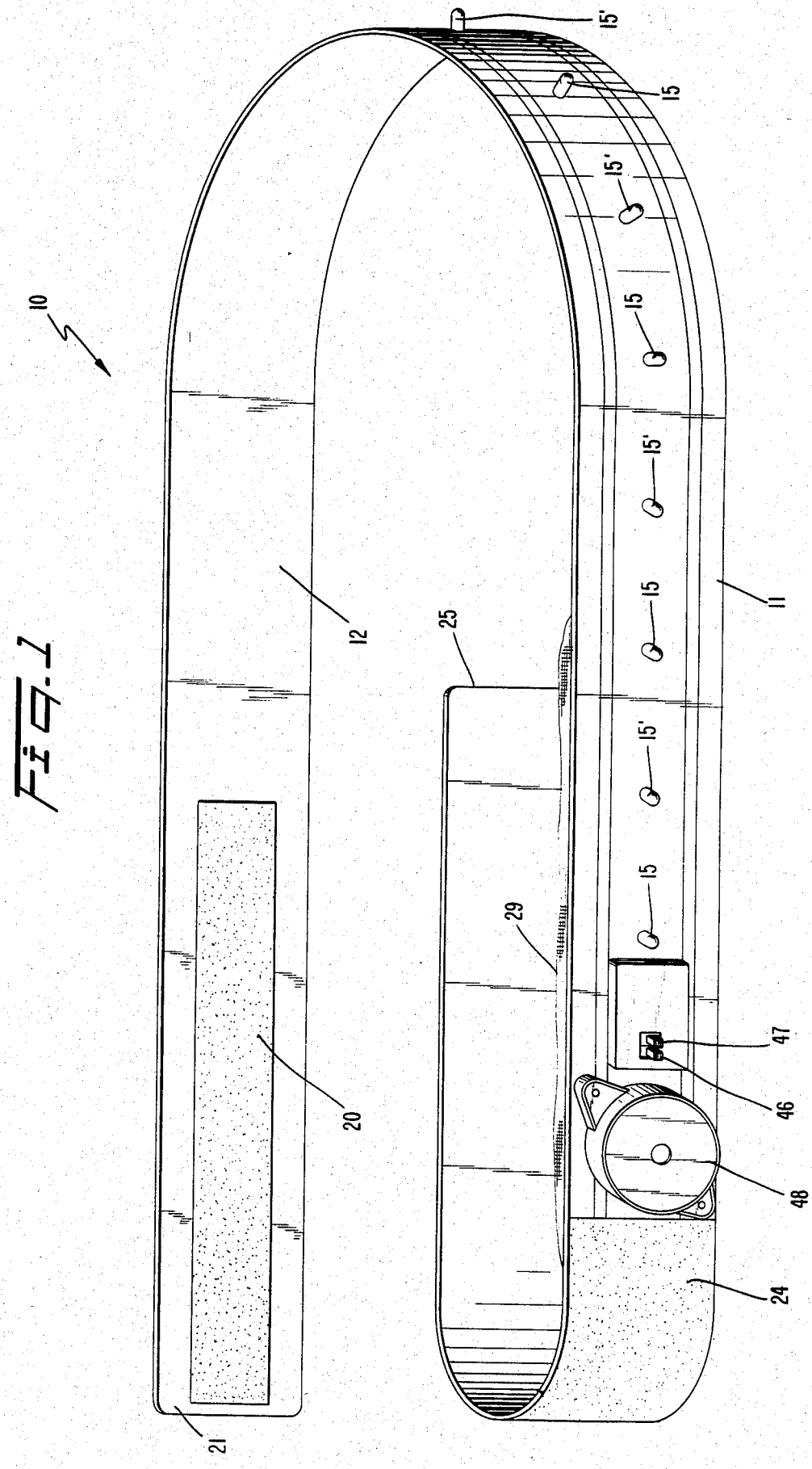

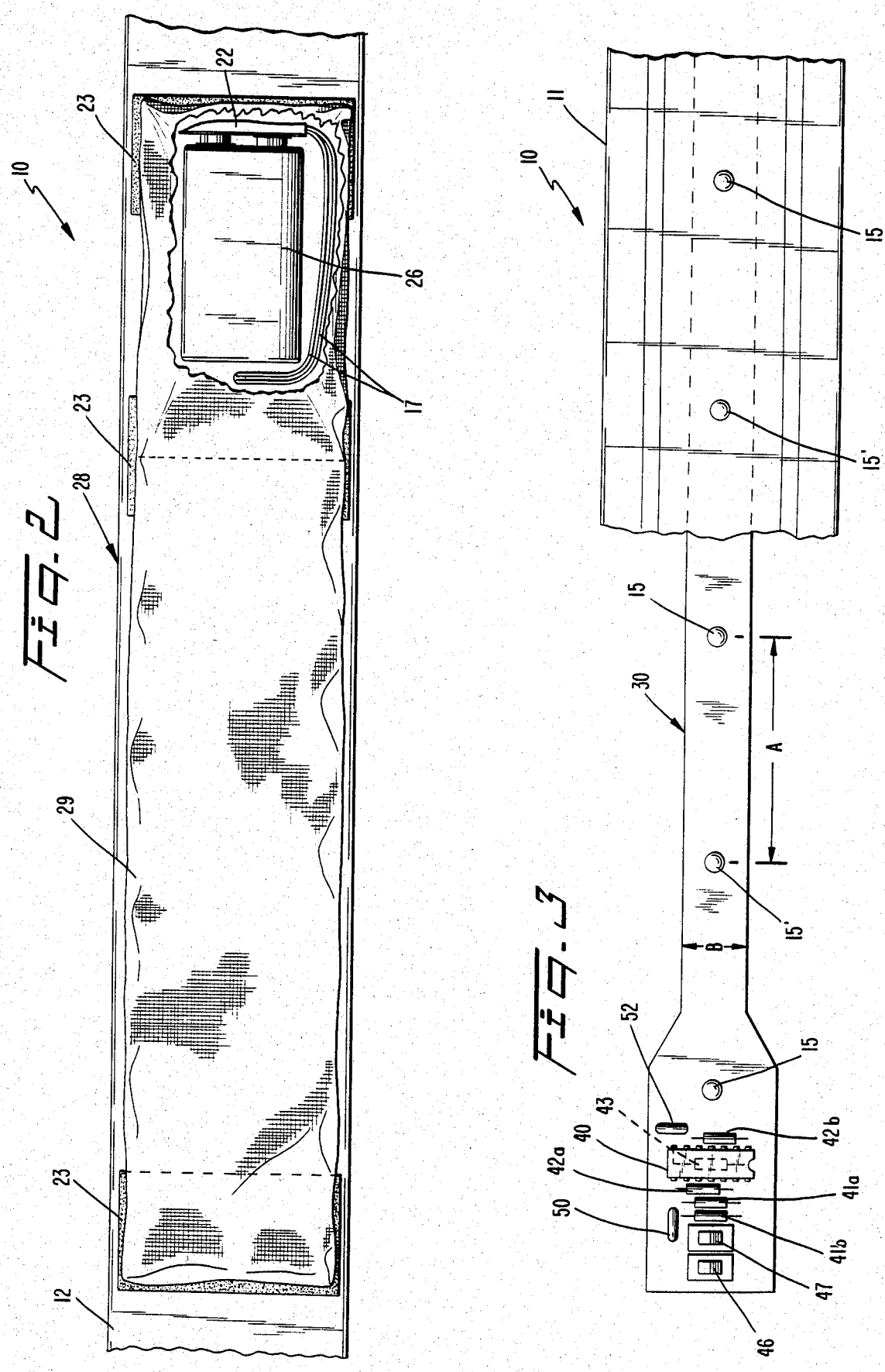

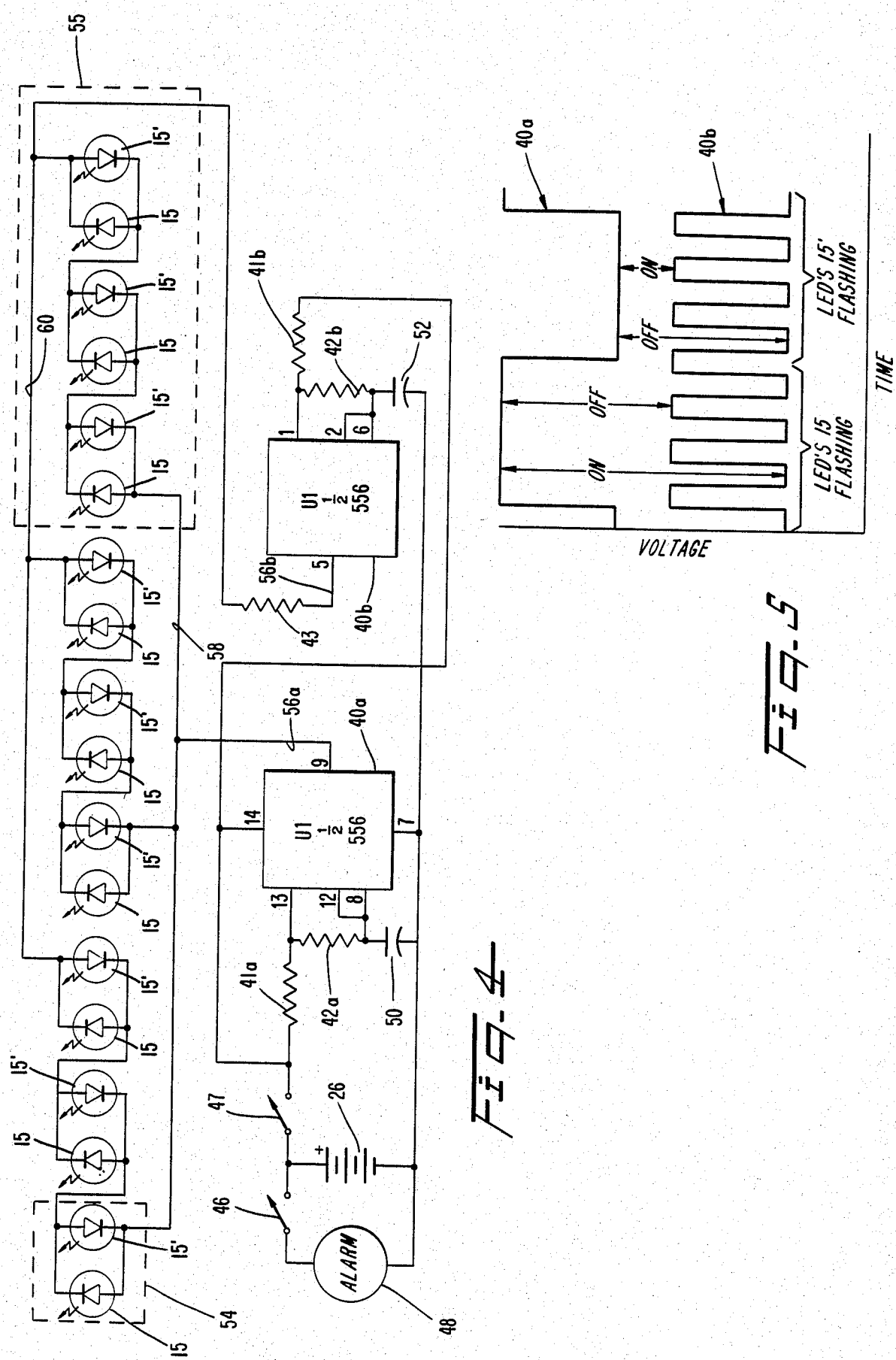

FLEXIBLE SAFETY BELT WITH FLASHING LIGHT-EMITTING DEVICES AND ALARM

This application is a continuation-in-part of Ser. No. 533,233, filed Sept. 19, 1983, now abandoned.

TECHNICAL FIELD

The present invention relates to apparatus worn on the body to increase the visibility of the wearer under conditions of low ambient light and in particular discloses the construction of a belt to be worn about the torso or a limb of the wearer which includes reflective material and an array of intermittently lighted light-emitting devices disposed along substantially the entire length of the belt. Additionally, the apparatus includes a separately switched alarm device.

BACKGROUND OF THE INVENTION

In recent years a great interest in people's physical well being, generally described as the art of "physical fitness", has developed in the United States. During this time, the sight of people running has become very common on the streets, sidewalks and parks of the country.

The activity of regular running to improve one's cardiovascular system is normally referred to as the practice of "jogging".

Jogging has become particularly popular with that portion of the population between the ages of 20 and 40 in middle and upper income brackets. As a result of the popularity of jogging within this segment of the population, much jogging occurs in the late evening or, after darkness has fallen, because many joggers within the above noted segment of the population are regularly employed and can only jog during the hours before or after work. Thus, there are a number of joggers on the streets in the evening, early dawn, and pre-dawn hours.

Many joggers inhabit, and also jog in, suburban areas where publicly provided amenities such as street lights and sidwalks do not exist. Also, in many urban areas where sidewalks have fallen into disrepair, joggers prefer using the superior surfaces of the paved streets and roads rather than uneven broken sidewalks.

Since, as described above, joggers have come to populate the same streets and roads as traveled by automobiles, there has been an alarming, but not unexpected, increase in the number of vehicle-jogger collisions in the United States over the last few years. In the overwhelming majority of such collisions, the joggers are the parties severely damaged, and jogger fatalities due to being struck by automobiles have also risen dramatically.

In response to this, there is clearly a need for devices which will improve the visibility of joggers to drivers of motor vehicles under conditions of low ambient light. In response to this need, a number of devices have been developed in an attempt to render the jogger visible to drivers and to thus lower the probability of the jogger being struck by a motor vehicle.

One common device is a reflective vest worn on the torso of the jogger to reflect light from the headlamps of motor vehicles. This device has provided for improved safety, but is entirely dependent on the operation and proper alignment of the headlights of a motor vehicle in order to render the jogger visible to the driver. Thus, if the operator of the vehicle is, for example, intoxicated and has forgotten to turn on the headlamps, particularly in the early evening hours where the ambient light is very low, but complete darkness has not fallen, a reflective vest may not aid the jogger in improving his visibility to drivers. Furthermore, even though these vests tend to be lightweight and open at the sides, they do have the effect of retaining some heat around the body of the jogger which can increase the jogger's discomfort while jogging during the summer months. Further, since headlamps are typically aligned to shine in a downward direction, often the reflective vest is worn at a sufficiently high level off the ground so as to preclude reflection of headlamp light therefrom.

Also, active light-emitting devices have been developed and sold for attachment to the limbs of joggers. Some joggers use the familiar leg light used by bicyclists which consists of a self-contained battery pack, a lamp and reflector, and a strap for securing the device to the arm or leg of the wearer. Still more recently, a similarly arranged package including a flashing light, a dispersive lens, and a strap for attaching to the arm of the jogger has been created.

While such active devices are an improvement over passive devices, or may be used in combination therewith, they still have some drawbacks.

First and foremost is the fact that even with a dispersing lens, the angle from which such devices are visible, usually does not exceed 180°. Thus, if the vehicle is approaching the jogger from a direction in which such a device is not visible, the driver may not see the jogger until it is too late. Of course this can be overcome by the wearing of multiple lamps but this approach adds extra weight to the jogger.

Furthermore, in order to adequately secure such devices to the arms and legs of joggers, they must be strapped around the appendage rather tightly in order to make sure that they do not come dislodged during jogging. This causes the jogger to make a trade-off between his or her comfort during jogging and the expediency of increasing his or her visibility to drivers of motor vehicles.

Additionally, there is sometimes the need for a jogger to be able to audibly signal a fellow jogger that the former jogger is about to pass the latter jogger so that the latter jogger may move aside to enable passing. Further, audible signals might be useful in repelling attackers or for other purposes.

Thus, there is a need within the field of jogging for a lightweight active light-emitting safety device which can be worn by a jogger or other person occupying the streets under conditions of low ambient light, which may be comfortably worn without unduly constricting the blood vessels of the wearer, and which radiates light so that the jogger will be visible from virtually any angle of approach by an oncoming vehicle. There is also a need for such a device including the additional structure of a controllable audible alarm device.

The following prior art is known to applicants: U.S. Pat. Nos. 3,104,454, 3,871,170, 3,944,803, 4,161,018, 4,231,079, 4,264,845, 4,283,756 and 4,384,317.

SUMMARY OF THE INVENTION

The present invention fulfills the needs recited above by providing a light weight apparatus, preferably in the form of a hollow belt, having an array of light-emitting devices arranged in spaced-apart relationship along substantially its entire length. The present invention includes a flexible circuit board attached to the belt having a foil pattern for connecting the light-emitting devices to an oscillator and a source of power, to cause the light-emitting devices to flash intermittently.

The preferred form of the invention is a belt which may be worn around the torso of the user and includes a fastener for joining the ends of the belt together.

In its preferred form, the light emitting devices are light-emitting diodes and the combination of a pair of oscillators and their interconnection with the light-emitting diodes form a novel flasher circuit. The circuit provides improved efficiency of light output, and requires no external gates which dissipate power (and thus deteriorate battery life) in order to establish an otherwise known pattern of flashing. While the preferred form is a belt designed to specifically address the problem referenced above, it will become apparent from the detailed description that embodiments of the invention which may be worn around the appendages of joggers may also be constructed.

Additional aspects of the preferred form of the present invention include an arrangement of the oscillator so that at least two distinct subsets of the light-emitting devices are intermittently in a state of flashing and continued darkness. This is accomplished by having the oscillator which selects the subset of light-emitting devices which is currently being flashed having a frequency which is lower than the flashing frequency of the oscillator controlling the activated devices.

Also, in its most preferred form, the outer perimeter of the belt upon which the light-emitting devices are mounted is also constructed of a reflective material so that, in addition to the active light output from the light-emitting devices, the passive reflection of lights from the headlamps of motor vehicles will be provided.

In a further aspect of the preferred embodiment of the present invention, an alarm circuit is included in the belt which is controlled by a separate switch from the switch which controls the lighting devices.

Thus, it is an object of the present invention to provide an improved active light-emitting safety apparatus for pedestrians and/or runners under conditions of low ambient light which overcomes the drawbacks of the prior art.

It is further an object of the present invention to provide a light-emitting apparatus for pedestrians in the dark which has a substantially uniform radial output of light so that the wearer may be seen from virtually any angle of approach.

It is a further object of the present invention to provide an apparatus for providing an active light output to render the wearer visible under conditions of low ambient light which includes a novel flashing circuit which may be readily constructed from an available integrated circuit timer requiring no external gating, thus providing an improvement in battery life over previously available battery operated devices designed to be worn in the dark.

It is a further object of the present invention to provide such a safety apparatus with the further provision of a separately switched alarm device.

It is a still further object of the present invention to provide a safety apparatus usable not only by joggers but also by firemen, by policemen, especially those officers directing traffic at night and by airline personnel whose work involves standing on the tarmac.

These and other objects, advantages and aspects of the present invention will become apparent from the detailed description below, when read in conjunction with the appended drawing figures.

BRIEF DESCRIPTION OF THE DRAWINGS

FIG. 1 shows a perspective view of the preferred embodiment of the present invention.

FIG. 2 shows a partial view of the inside face of the belt opposite the switch means and alarm shown on FIG. 1, with portions of a battery holding means broken away to show detail.

FIG. 3 shows a front view of the flexible circuit board of the present invention.

FIG. 4 shows a schematic diagram of the preferred form of the electrical circuitry of the present invention.

FIG. 5 shows a graph of voltage versus time for the two oscillators of the present invention.

DETAILED DESCRIPTION OF THE PREFERRED EMBODIMENTS

Turning now to the drawing figures in which like numerals represent like parts, the preferred embodiment will now be described. FIG. 1 shows a perspective view of a preferred embodiment of the safety belt of the present invention, shown generally at 10. The belt is constructed from a hollow belt construction formed by an outer surface 11 and an inner surface 12 attached together by adhesive or stitching (not shown). In the preferred form, outer surface 11 is constructed of reflective material to provide passive reflection of light from the headlamps of an oncoming vehicle. Disposed in spaced apart relationship along substantially the entire length of the belt are a plurality of light-emitting diodes (LEDs) 15, and 15' with the LED's 15 connected to flash together and the LED's 15' connected to flash together when the LED's 15 are not flashing and vice versa, as will be explained hereinafter with regard to FIG. 4. In use, the belt is joined about the waist of the wearer by a fastening means which is preferably embodied as a strip of flexible plastic eyelet material 20 at end 21 of the belt which has a mating strip of flexible plastic hook material, shown at 24, at end 25 of the belt. Such a fastening arrangement including strips of flexible hooks and eyelets is known to those skilled in the art and its most common and popular form is that which is sold under the trademark of Velcro. This Velcro-type fastening means allows infinite adjustment of the length of the belt for maximum comfort of the user.

A battery holding pouch 28 is preferably provided on inner surface 12 near the end 25 of the belt. Of course, the battery may be disposed on the outside of the belt or anywhere else if desired.

The placement of the battery in the preferred form of the present invention has been made because it does not require disturbance of the regularity of the pattern of placement of LEDs 15 and 15' and it has been found that the use of NEDA type of 1604A nine volt batteries, which are used to power the preferred embodiment, will fit comfortably on the inside surface 12 of the belt for most wearers.

The preferred placement for battery pouch 28 in the control circuitry discussed hereinbelow is at a point near end 25 of the belt shown in FIG. 1. An embodiment of the present invention has been constructed, as shown in FIG. 2 using a hollow tube of cloth 29 as a holder for the battery 26. This is attached to inner surface 1 by strips of hook and eye material 23. A portion of the cloth tube 29 in this construction may also be used as a pouch for holding money, keys and other small objects which the use may wish to carry while jogging. As shown in FIG. 2, the battery 26 is connected into the circuit by clip 22 and wires 17 which connect with the electrical circuitry as shown schematically in FIG. 4.

Turning next to FIG. 3, a front view of the preferred embodiment of circuit board is shown which comprises the flexible circuit board 30. The preferred form of constructing the combination of surfaces 11 and 12 holding flexible circuit board 30 is to make small perforations (not shown) through which the leads of LEDs 15 and 15' may pass, but which will be completely covered by the bases of LEDs 15 and 15'. The LEDs are then soldered onto the appropriate foil strips (not shown) of flexible circuit board 30. After this step, surfaces 11 and 12 are attached by stitching or adhesive (not shown).

An alternate arrangement for construction which is easier, but which provides a less attractive resultant product, is to completely construct circuit board 30, including the attachment of LEDs 15 and 15' thereto, and then to place outer surface 11 which has appropriately spaced holes of sufficient size for the entire body of LEDs 15 and 15' to pass therethrough over the board. After this step, surfaces 11 and 12 are joined together surrounding board 30.

A third arrangement for constructing the belt of the present invention, which has been used by the inventors, is to assemble circuit board 30 including installation of light-emitting diodes 15 first. When this is completed, a piece of suitable cloth material to form inner surface 12 is placed below the circuit board. A perforated strip of reflective tape with an adhesive backing thereon is laid over this assembly so that light-emitting diodes 15 and 15' pass through the perforations and thus the reflective tape forms outer surface 11. The width of the tape is selected so that an adequate amount is provided to fold over the top and bottom edges of the belt and have the adhesive of the tape become secured to the piece of material forming inner surface 12. In this manner, the necessity for using stitching is obviated.

It is also possible to completely assemble circuit board 30 and then place same in a mold. Flexible plastic material can then be injection molded around the board providing a sealed waterproof belt. It will be appreciated that this construction provides a hollow belt as that term is used in this specification.

Any of the foregoing constructions for the belt, as well as others which will suggest themselves to persons skilled in the art, may be used to construct embodiments of the present invention.

Two dimensions, shown as A and B for the preferred embodiment, are shown in FIG. 3. The preferred length for dimension A is 5 centimeter intervals. Dimension B is preferably 1.9 centimeters and thus it will be seen that flexible circuit board 30 may easily be inserted into a belt of convenient size for wear by the user.

While the foil patterns on circuit board 30 are not shown, it will be readily apparent from the description of FIG. 4 below that construction of the connecting means of the present invention requires no more than four separate parallel foil sections to be provided over any one portion of the length of flexible circuit board 30. It will be appreciated by those skilled in the art of circuit board design that it is extremely easy to provide flexible circuit boards having four foil strips within the space of dimension B, as described above.

A preferred form for the mounting of components of the oscillator circuit is shown in FIG. 3. It may be seen that the oscillator is constructed around a conventional type 556 dual timer integrated circuit shown as 40. A plurality of resistors 41a, 41b, 42a, 42b and 43 are shown on the board. Timing capacitors 50 and 52 are also shown. As can be seen in FIG. 3, except for capacitor 50, all other components are mounted on the flexible circuit board 30 in substantially parallel relation. This configuration has been chosen so that the board 30 may be flexed in the region of the capacitors and resistors for the comfort of the wearer. In the illustration in FIG. 3, it may be readily appreciated that use of the simple oscillator and flasher circuit of the present invention provides apparatus which may be easily placed on a flexible circuit board of the dimensions described above. The preferred form of resistors 41 and 42 are conventional quarter watt carbon composition resistors with capacitors 50 and 52 being preferably Mylar capacitors. FIG. 3 also shows the LED's 15 and 15' as well as switches 46 and 47. The switch 47 controls the operation of the LED's while the switch 46 controls the operation of the alarm 48. The resistor 43 comprises a current limiting resistor which has been found to prolong battery life while not appreciably reducing the light output of the LED's 15 and 15'.

Turning next to FIG. 4, the circuit diagram for the preferred form of the present invention is shown. As is illustrated in the lower portion of FIG. 4, the oscillator circuit of the present invention is constructed from two separate oscillators, each constructed around one timer of the 556 type dual timer chip such as currently manufactured by Signetics. The preferred form of the present invention includes a low power CMOS pin for pin duplicate of the bipolar type 556, which is currently manufactured by Fairchild Semiconductor. There are many manufacturers of this same integrated circuit. It will also be noted from inspection of FIG. 4 that a pair of type 555 timer circuits, as well as a number of other alternate arrangements, including oscillators constructed from discrete components, may be used to construct embodiments of the present invention.

The present invention includes a pair of astable oscillators, each characterized by a distinct oscillator output frequency. The timing elements for each of the oscillators have values selected according to well known formula published by many manufacturers of type 555 and 556 integrated circuits which will not be repeated herein. For example, the formulas for determining period and duty cycle for oscillators built around 555 and 556 timers may be found in "Signetics Analog Data Manual" published by Signetics Corporation of Sunnyvale, Calif., which is hereby incorporated by reference. In the preferred embodiment, oscillator 40b is constructed by selecting values for resistors 41b and 42b and capacitor 52 so that the output which appears on oscillator output 56b is on the order of 3 Hz.

Oscillator 40a, which is the lower frequency oscillator of the preferred embodiment, is constructed using resistors 41a and 42a and capacitor 50 so that its output frequency is slightly less than 1 Hz. In the preferred embodiment, the output signal on line 56a has a characteristic oscillator frequency of slightly less than 1 Hz.

The following values for the resistors and capacitors of the present invention has been used in one embodiment thereof, however, they are not to be considered limiting, in any way, on the invention: resistors 41, 1 megaohm; resistors 42, 6.8 megaohm; resistor 43, 24 ohm; capacitor 50, 0.22 microfarad; capacitor 52, 0.027 microfarad.

The particular selection of the preferred frequencies and duty cycles should not be considered limiting to the present invention and other frequency pairs will suggest themselves to those skilled in the art. However, it is considered to be an important aspect of the preferred form of the present invention that the lower frequency oscillator constructed around timer section 40a have a frequency not greater than 5 Hz with the frequency of the other oscillator being at least twice that. This is to assure that the group of diodes selected to be flashed (the groups being selected by oscillator 40a) be switched at a low enough frequency so that the persistence of the eye and the LEDs does not make it appear that all diodes are continuously illuminated. It has been found by the inventors of the present invention that the combination of flashing LEDs when they are activated and changing the subsets of the plurality of LEDs that are activated, to be flashed, provides a visible output which attracts the attention of observers more readily than either constant illumination, or constant flashing of all LEDs.

Turning first to the pair of LEDs shown within dashed line 54, an inspection of the other exemplary LEDs shown in FIG. 4, it will be appreciated that the preferred arrangement provides a plurality of diode pairs, such as diode pair 15 and 15' in dashed line 54 wherein, within each pair, the anode of one diode of the pair is connected to the cathode of the other.

The entire connection means of the present invention will be further illustrated in connection with the three pairs shown within dashed block 55. It should be noted that, within each pair, one diode has been labeled 15 and the other diode has been labeled 15'. Output line 56a from oscillator 40a is connected to line 58. Similarly, output line 56b from oscillator 40b is connected to line 60 via resistor 43. It will be readily appreciated by those skilled in the art that line 58 and all the lines which are electrically identical thereto form a single node within the meaning of that term in circuit theory. Thus, line 58 is referred to as a major node in this specification. Similarly, line 60 forms another major node. It will further be appreciated that one of output lines 56 from each of the oscillators is connected to one of the above-mentioned major nodes.

From inspection of FIG. 4 it will be further appreciated that when major node 58 is positive with respect to major node 60, the three diodes show as 15 within block 55 will be forward biased with the 15 diodes being reverse biased. When node 60 is positive with respect to node 58, diodes 15' will be forward biased and diodes 15 will be reverse biased.

Having considered this connection arrangement, the simplicity of operation of the preferred embodiment will be appreciated. Oscillator 40a alternately places node 58 in a condition of relatively positive and relatively negative voltage corresponding to the logical one and zero, respectively, outputs on line 56a. When node 58 is held positive by the output of low frequency oscillator 40a, diodes 15 will be forward biased, thus conducting current and emitting light, during the negative portion of the output on line 56b, and will be unbiased during the positive portion of this output. Under the same conditions, diodes 15' will be reverse biased, thus not conducting, during the negative portions of the output on line 56b and will be unbiased during the positive portions of this output.

Thus, under the conditions described, keeping in mind that the frequency of the output of oscillator 40b exceeds that of oscillator 40a, only diodes 15 will be flashed leaving diodes 15' extinguished. From the symmetry of the arrangement, it will be readily appreciated that when the output of oscillator 40a goes low, diodes 15 will remain extinguished during changes of state of the output on line 56b and diodes 15' shown in block 55 will be caused to flash. Thus, it will be seen that the low frequency oscillator 40a selects a subset of the plurality of light-emitting diodes 15 or 15' which are alternately conditioned to flash in response to the output of oscillator 40b.

In the preferred form of the present invention, the physical arrangement of the diodes is as illustrated in FIG. 4 so that the subset which is activated by oscillator 40a will be each alternate diode as one travels along the length of the belt. However, many other physical arrangements of LEDs are considered within the scope of the present invention.

It will be readily apparent to those skilled in the art that additional diode pairs, such as pair 54 may be attached in series with the pairs shown within block 55 so that each diode will carry an appropriate amount of current and have an appropriate forward voltage drop across its terminals during conduction. Thus, various combinations of output voltages during the positive states of the oscillator outputs on lines 56 together with various sets of diodes corresponding to diodes 15 and 15' within block 55 may be selected so that no current limiting resistors are required. Furthermore, the arrangement of attaching oscillators 40a and 40b to major nodes 58 and 60, and connecting the diodes as described above, provides an arrangement for alternately flashing two distinct subsets of the diodes used in the present invention without the use of any additional gating. By avoiding the use of current limiting resistors and additional gating to perform the selection process for the activated subsets of diodes, dissipated power is kept to a minimum thus increasing the useful life of battery 31.

FIG. 5 shows a graph of voltage versus time for the oscillators 40a and 40b. As shown, when the oscillator 40a places a relatively positive voltage on the node 58, the oscillator 40b causes the LED's 15 to flash, whereas when the oscillator 40a places a relatively negative voltage on the node 58, the oscillator 40b causes the LED's 15 to flash.

Referring back to FIG. 4, an alarm 48 is shown connected to the battery power supply 26 through switch 46. As shown the alarm 48 is connected in parallel with the LED's with respect to the battery 26 so that the alarm 48 may be operated independently of the LED's or simultaneously therewith. The alarm 48 may comprise any conventional horn-type or buzzer type audible device which may sound sufficiently loudly so as to warn other joggers that a person wearing the belt 10 is waiting to pass or for other reasons such as the scaring off of attackers. The alarm emits a high frequency sound which has been found to be useful in warding off dogs.

Based on the foregoing description of the preferred embodiment, other embodiments of the present invention will suggest themselves to those skilled in the art and thus the scope of the present invention is to be limited only by the claims below.

What is claimed is:

1. Apparatus for increasing visibility of a wearer under conditions of low ambient light comprising in combination:

a hollow belt of flexible material characterized by a pair of ends;

fastening means connected to said pair of ends for securing said pair of ends together;

a plurality of light-emitting devices disposed in spaced apart relationship along the length of one side of said belt of flexible material and connected in a plurality of subsets of light-emitting devices;

an elongated strip of flexible circuit board enclosed with the interior of said hollow belt, said flexible circuit board including oscillator means and connecting means for connecting said oscillator means to said plurality of light-emitting devices, whereby said light-emitting devices are caused to be intermittently lit, said oscillator means controlling which particular subset is intermittently lit while also controlling the intermittent lighting of the particular subset chosen to be intermittently lit;

further wherein an alarm means is connected to said circuit board in parallel with said light-emitting devices with respect to a power source of said circuit board; and further including means controlling the activation of said alarm means comprising a first manually controlled on-off switch, and further including a second manually controlled on-off switch for controlling the activation of said light-emitting devices.

2. Apparatus as recited in claim 1 wherein said light-emitting devices are light-emitting diodes and said subsets comprise subsets of light-emitting diodes.

3. Apparatus as recited in claim 2 wherein said oscillator means includes a first astable oscillator characterized by a first frequency and a first oscillator output, and a second astable oscillator characterized by a second higher oscillator frequency in a second oscillator output;

said connecting means comprises means interconnecting a plurality of said light-emitting diodes as diode pairs, wherein, for each said diode pair, the anode of one member is connected to the cathode of the other member of said diode pair to form a plurality of node pairs and further wherein all diodes connected into said circuit board with like polarity form respective subsets of diodes whereby two subsets of diodes are formed; and means connecting one of said node pairs to said first oscillator output and the other of said node pairs to said second oscillator output for each of said diode pairs said first oscillator controlling which particular subset of diodes is intermittently lit and said second oscillator controlling the intermittent lighting of the particular subset of diodes chosen by said first oscillator to be intermittently lit.

4. Apparatus as recited in claim 2 wherein said oscillator means includes a first astable oscillator characterized by a first frequency and having a first oscillator output and a second astable oscillator characterized by a second frequency and having a second oscillator output;

said connecting means comprises a first major node and a second major node and means for connecting said plurality of light-emitting diodes between said first major node and said second major node so that a first of said subsets of said plurality of light-emitting diodes is forward biased and that a second of said subsets of said plurality of light-emitting diodes is reverse biased when said first major node has impressed upon it a voltage which is positive with respect to said second major node; and means connecting said first oscillator output to said first major node and for connecting said second oscillator output to said second major node.

5. Apparatus as recited in claim 4 wherein said first oscillator frequency is less that five Hertz and said second oscillator frequency is at least two times said first oscillator frequency.

6. Apparatus as recited in claim 1 wherein said fastening means includes a strip of flexible hook material attached to one of said pair of ends and a strip of flexible eye material attached to the other of said pair of ends.

7. Apparatus as recited in claim 1 further including flexible light reflecting means for reflecting ambient light attached to substantially cover all of said one side of said belt of flexible material.

8. Apparatus as recited in claim 1, where said alarm means includes a buzzer.

* * * * *